United States Patent [19]

Neumann

[11] Patent Number: 4,859,188
[45] Date of Patent: Aug. 22, 1989

[54] WIRE/DISK BOARD-TO-BOARD INTERCONNECT DEVICE

[75] Inventor: Eugene F. Neumann, Chippewa Falls, Wis.

[73] Assignee: Cray Research, Inc., Minneapolis, Minn.

[21] Appl. No.: 306,229

[22] Filed: Feb. 3, 1989

Related U.S. Application Data

[63] Continuation of Ser. No. 104,848, Oct. 5, 1987, abandoned.

[51] Int. Cl.⁴ ............................................. H01R 29/00
[52] U.S. Cl. ........................................ 439/45; 439/65; 439/83
[58] Field of Search ................................ 439/55, 65–69, 439/74–78, 81–83, 860, 863, 816, 821, 839, 842, 843, 851–853, 43, 44, 45, 46, 49, 50, 51

[56] References Cited

U.S. PATENT DOCUMENTS

| | | | |
|---|---|---|---|
| 3,022,480 | 2/1962 | Tiffany | 439/45 |
| 3,079,577 | 2/1963 | Brownfield | 439/55 |
| 3,097,032 | 7/1963 | Hochheiser | 339/17 |
| 3,205,298 | 9/1965 | Kalt | 174/68.5 |
| 3,212,049 | 12/1965 | Mittler et al. | 339/18 |
| 3,568,001 | 3/1971 | Straus | 317/101 |
| 3,619,478 | 11/1971 | Staiger | |
| 3,670,409 | 6/1972 | Reimer | 439/55 |
| 3,718,750 | 2/1973 | Sayers | 174/94 R |
| 4,076,356 | 2/1978 | Tamburro | 339/17 C |
| 4,295,184 | 10/1981 | Roberts | 361/406 |

FOREIGN PATENT DOCUMENTS

| | | | |
|---|---|---|---|
| 2417236 | 9/1979 | France . | |
| 0130719 | 1/1985 | Japan | 439/75 |
| 85/02751 | 6/1985 | PCT Int'l Appl. . | |

OTHER PUBLICATIONS

"Packaging Techniques", K. S. Hinkley, Jr. et al., *IMB Technical Disclosure Bulletin*, vol. 9, No. 7, Dec. 1966.

"Stack Assembly of Printed Circuit Cards", M. Kubota, *IBM Technical Disclosure Bulletin*, vol. 23, No. 12, May 1981.

*Primary Examiner*—David Pirlot
*Attorney, Agent, or Firm*—Merchant, Gould, Smith, Edell, Welter & Schmidt

[57] ABSTRACT

An apparatus and method for creating a stack assembly of print circuit boards and for providing electrical interconnection between the individual through-plated hole pads of the circuit boards is described. The preferred embodiment of the present invention is a device comprised of two parts: a slotted disk and a wire. The slotted disk is attached to the surface of the printed circuit board so as to cover a hole pad and form an electrical connection therewith. The covered holes of the printed circuit board are axially aligned between circuit boards and an electrically conducting wire is inserted through the slotted disks on the circuit boards to form an electrical connection therewith.

4 Claims, 2 Drawing Sheets 4,859,188

WIRE/DISK BOARD-TO-BOARD INTERCONNECT DEVICE

This is a continuation of application Ser. No. 104,848 filed Oct. 5, 1987, which was abandoned upon the filing hereof.

TECHNICAL FIELD OF THE INVENTION

The present invention relates to wire/disk board-to-board interconnect devices for use in creating a stacked assembly of printed circuit boards.

BACKGROUND OF THE INVENTION

Current methods for creating a stacked assembly of printed circuit boards and for providing an electrical interconnection between individual holes of the circuit boards are often accomplished with complex, large or unreliable connecting devices. Various methods and structures have been used to provide such interconnection, like the utilization of electrically conductive pins and bushings. This two-step method of interconnection requires the insertion of bushings into holes between which connection is desired, then insertion of pins into the bushings.

Another method of interconnection does not mandate the use of bushings, but does require a large amount of force to insert the pins directly into the holes and still provide a solid electrical connection. If greater space between the pin and the hole is provided, such that insertion is easier, the electrical connection is less sound.

Other problems in the prior art center on the ability of current methods of interconnection to be miniaturized only to a certain degree, a difficulty of great importance given the ever-increasing miniaturization of other electrical components.

The present invention overcomes the above-enumerated problems and other shortcomings associated with current printed circuit board interconnection devices.

SUMMARY OF THE INVENTION

The present invention relates to a device for detachably interconnecting stacked printed circuit boards. The device is of two parts: a slotted disk and a wire. The slotted disk may be connected to the surface of a printed circuit board so as to cover a hole pad in the printed circuit board. The hole of the printed circuit board may be plated through with a conducting metal, so as to provide good electrical conduction in the circuit. In the preferred embodiment, this conducting metal is a noble metal such as gold.

The wire of the device is made of a conducting material and when in use extends through a plurality of slotted disks and the printed circuit boards to which the disks are attached. Thus, the wire may detachably interconnect individual portions of a plurality of printed circuit boards.

The slotted disk through which the wire extends is of a thin, substantially flat character and has at least three slits meeting at a common point at substantially the center of the disk, then extending along radii of the disk nearly to its edge. The slits are formed by chemically etching or mechanically punching a single-sided etch (top-down) in the disk. This action forms an angle of approximately 45 degrees in the edge of the etched slit, thus facilitating the entry of the wire.

An advantage of one embodiment of the present invention is its simple construction and use. After the disks have been secured to the printed circuit board, simple insertion of the wire provides a strong electrical contact, with no bushings or other additional parts necessary.

Another advantage of the present invention lies in the small amount of force necessary to provide a strong electrical contact between the printed circuit boards. This reduction in force from that necessary in the prior art is facilitated by the presence of the disks, so that more space may be provided between the wire and the through-plated hole of the printed circuit board, and by the approximately 45 degree angle etched in the slots of the disk, which allows easy entry of the wire into and through the disk.

Still another advantage of the present invention is its ability to be miniaturized to a great degree, allowing compatibility with other miniaturized electrical components.

The above-described features and advantages, along with various other advantages and features of novelty, are pointed out with particularity in the claims annexed hereto and forming a part hereof. However, for a better understanding of the invention, its advantages, and objects attached by its use, reference should be had to the drawings which form a further part hereof and to the accompanying descriptive matter in which there is illustrated and described a preferred embodiment of the invention.

BRIEF DESCRIPTION OF THE DRAWINGS

In the drawings, in which like reference numerals generally indicate corresponding parts throughout the several views.

DETAILED DESCRIPTION OF THE INVENTION

In the following detailed description of the preferred embodiment, reference is made to accompanying drawings which form a part hereof, and in which is shown by way of illustration a specific embodiment in which the invention may be practiced. This embodiment is described in sufficient detail to enable those skilled in the art to practice the invention and it is to be understood that other embodiments may be utilized and that structural changes may be made without departing from the scope of the present invention. The following detailed description is, therefore, not to be taken in a limiting sense, and the scope of the present invention is defined by the appended claims.

Figure 1:
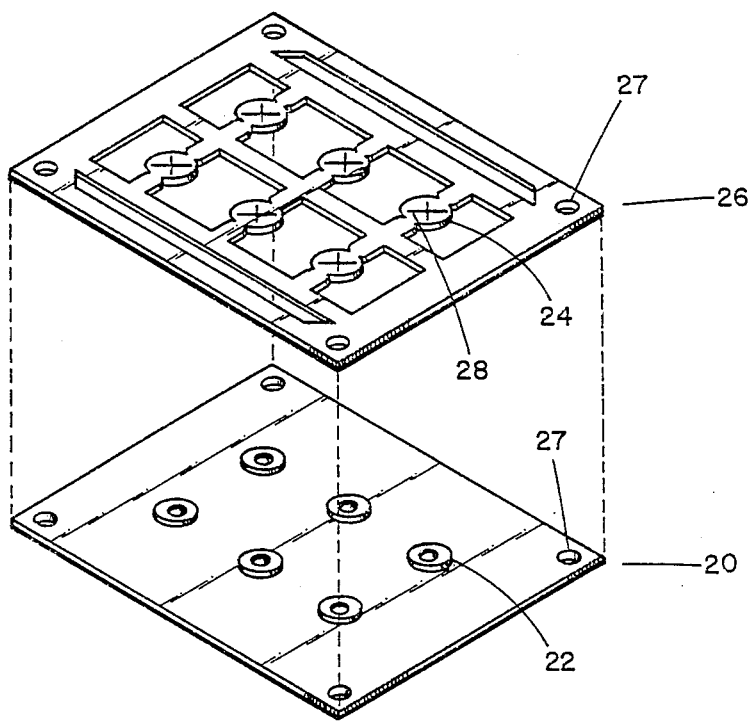
FIG. 1 is a perspective view of a universal disk pattern and a printed circuit board (PCB) in accordance with the principles of the present invention.

Referring now to the drawing, in FIG. 1 is illustrated a printed circuit board (PCB) 20 in accordance with the preferred embodiment of the present invention, which is intended for dense micro interconnections between stacked PCBs. The PCB 20 has hole pads 22 on which disks 24 are secured. Hole pads 22 extend through holes formed in PCB 20, and have flanged portions which extend axially beyond the surface of each PCB 20 to ensure proper spacing between PCB's and to provide a surface for supporting the disks 24. The hole pads 22 are plated through in the preferred embodiment with a noble metal such as copper, silver or gold; however, non-noble metals may be used as long as they are conducting, such as solder, tin, lead, etc. The disks 24 are formed of an electrically conducting material such as copper, silver or gold and are placed on the PCB 20 by aligning a universal etched disk pattern 26 with the PCB 20 through alignment holes 27, one disposed at each of the four corners of the PCB 20 and the universal etched disk pattern 26; pinning the alignment holes 27 together; then soldering, welding or bonding the disks 24 to the hold pads 22 of the PCB 20. Since the universal disk pattern 26 is constructed using a photolithography process, very accurate alignment can be achieved. After all disks 24 are secured to the PCB 20, the universal etched disk pattern 26 is peeled off and discarded, while the disks 24 remain secured to the PCB 20. The through-plated holes in the preferred embodiment are as small as 0.005 inch (0.127 mm) in diameter with the associated disks 24 being as small as 0.0083 inch (0.211 mm) across. The spacing is intended to be 5000 holes per inch in density. The wires 30 can be as small as 0.003–0.004 inch (0.0762–0.1016 mm) in diameter if the length is kept short (between 0.100–0.500 inch).

Figure 2:
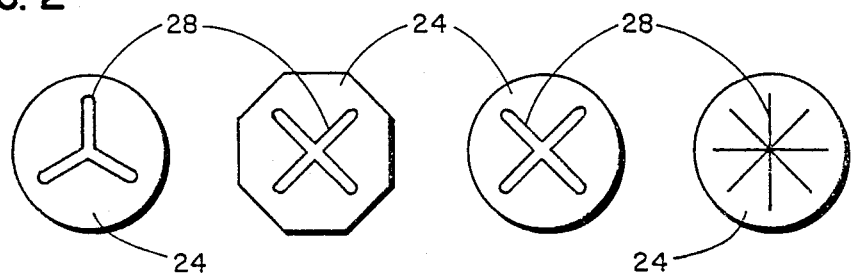
FIG. 2 illustrates several disks in accordance with the principles of present invention and shows various geometries which may be utilized in disposal of slits on the disk.
Figure 3:
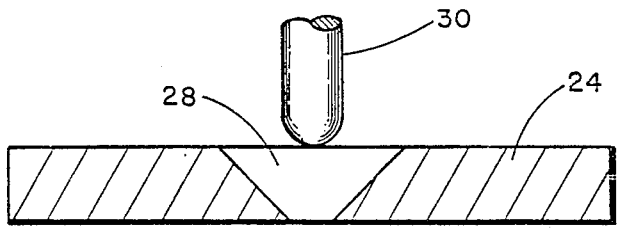
FIG. 3 is a cross-sectional view of the disk and wire, showing the 45° angle of the edge of the slit.
Figure 4:
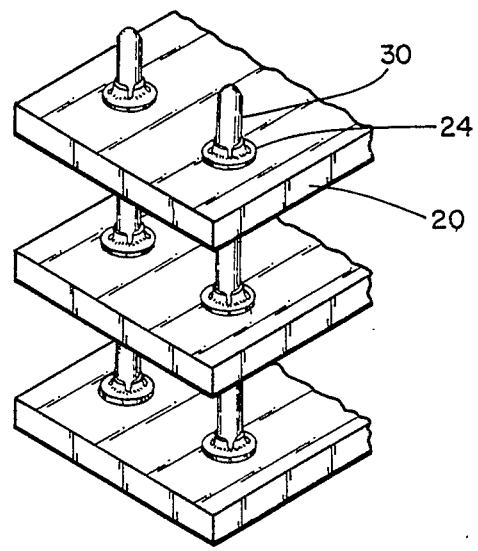
FIG. 4 is a perspective view of several stacked PCBs in accordance with the principles of the present invention.

Each disk 24 is composed of a substantially flat, thin portion of metal having at least three slits 28 meeting at a common point, as illustrated in FIG. 2. The size and shape of each disk 24 are designed to conform to the outside dimensions of the hole pads 22 on the PCB 20. The slits 28 of each disk 24 are formed by mechanically punching or chemically etching them into the disk 24, such that the slits 28 are disposed along radii of the disk 24 and meet at substantially the center of the disk 24 while extending nearly to the edges of the disk 24. A single-sided etch (top-down) of the disks 24 produces an angle of approximately 45° in the preferred embodiment in the edge of the etched slit, as shown in FIG. 3. This angle facilitates the entry of a stiff electrically conducting wire or rod 30 into the disk 24 and thus through the PCB 20. This wire or rod can be formed of any electrically conducting material such as gold, silver or copper alloys or as a metal plated non-conducting rod.

As the wire 30 enters the disk 24, it deforms the edges of the slits 28, such that a strong electrical contact is formed. The wire 30 is in the preferred embodiment commonly made of beryllium copper or stainless steel and plated with a noble metal such as gold. When wires 30 are pushed through a plurality of stacked PCBs 20, the circuits of one PCB 20 may thus be independently connected to circuits of other PCBs 20. The wire 30 is designed to allow the stacking of several PCBs 20. Disassembly of the stacked PCBs 20 may be accomplished simply by removing wires 30 from the PCBs 20, pulling the wires 30 in the same direction out of the PCBs 20 as they were pushed into the PCBs 20.

Figure 5:
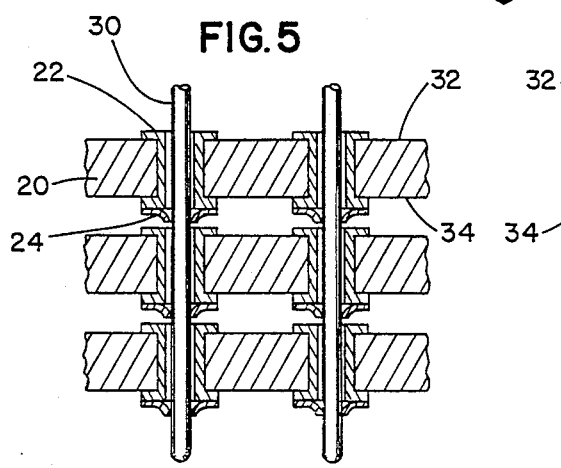
FIG. 5 is a cross-sectional view of FIG. 4, in which the disks are disposed on the lower face of the PCBs.
Figure 7:
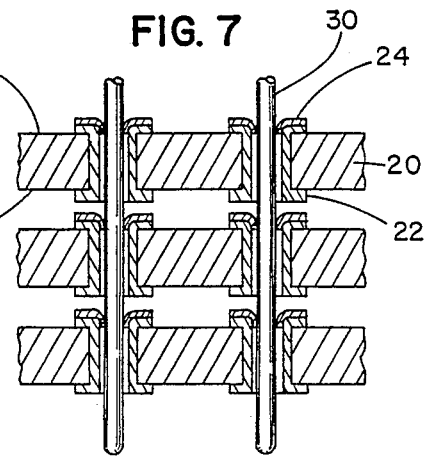
FIG. 7 is a cross-sectional view similar to FIG. 5, in which the disks are disposed on the upper face of the PCB.
Figure 6:
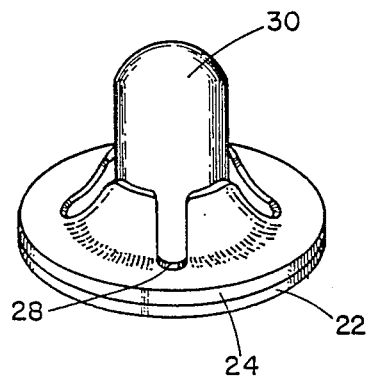
FIG. 6 is a perspective view of a hole pad, disk and wire in accordance with the principles of the present invention, illustrating the deforming action of wire as it passes through the slits of the disk.

The disks 24 of the PCB 20 can be made of beryllium copper or another metal having a spring-like character, then plated with a noble metal such as gold. Alternate methods of coating the beryllium copper would be evaporating or sputtering the gold onto the disks. Plating, however, is performed after formation of the slits 28 to insure edge coverage of the slits 28 by the plating. The disks 24 may then be bonded to either the upper face 32 or the lower face 34 of the PCBs 20 in the process previously described, as most clearly illustrated in FIGS. 5 and 7.

In use, the disks 24 are bonded to the PCB 20 through application of the universal etched pattern 26. The universal etched pattern 26 is then peeled away from the PCB 20, so that the disks 24 remain bonded to either face of the PCB 20. Several PCBs 20 are treated in this manner, so that a wire or wires 30 may be inserted through the disks 24 and thus connect individual circuits in a stack of the PCBs 20. A strong electrical contact is achieved and maintained in this connection through the deformation of slits 28 in the disks 24 by the wires 30. The wires 30 must be removed in the same direction in which they were inserted in order to unstack and disconnect the PCBs 20.

While the present invention has been described in connection with the preferred embodiment thereof, it will be understood that many modifications will be readily apparent to those of ordinary skill in the art, and this application is intended to cover any adaptations or variations thereof. Therefore, it is manifestly intended that this invention be limited only by the claims and the equivalents thereof.

What is claimed is:

1. A device for detachably interconnecting stacked printed circuit boards so that an electrical current may be established between trace connectors on the boards, comprising:
   a plurality of separate hole pad members each adapted to be received in a hole formed in a printed circuit board, each of said hole pad members having means defining a bore therein, said hole pad members further including flange portions which are adapted to extend axially beyond a surface of the printed circuit board;
   a plurality of thin, substantially flat separate disks each having slits meeting at a common point in a central portion thereof, each of said disks substantially conforming to the outside dimensions of and bonded to one of said flange portions of said hole pad members so said central portions of said disk is substantially aligned with said bore, said disks being adapted for electrical connection to trace connectors on the printed circuit boards; and
   a plurality of conducting rod means for insertion between said slits and into said bores, whereby an electrical connection may be made between the printed circuit board and another circuit board in a compact, high density arrangement.

2. A device in accordance with claim 1, wherein the disk is defined by the presence of at least three slits disposed only along radii of the disk, meeting at a common point at substantially the center of the disk and extending nearly to the edge of the disk and having no slots or apertures along the circumference of the disk.

3. A device in accordance with claim 1, wherein each of said bores is plated through with a conducting metal.

4. A device in accordance with claim 1, wherein said disks are constructed of a resilient base metal and are plated over with a bondable conducting metal.

* * * * *